(12) United States Patent
Wang et al.

(10) Patent No.: US 8,306,178 B2
(45) Date of Patent: Nov. 6, 2012

(54) VMOS MULTI-VALUED COUNTER UNIT

(75) Inventors: Peng Jun Wang, Ningbo (CN); Yue Jun Zhang, Ningbo (CN)

(73) Assignee: Ningbo University, Ningbo (CN)

( * ) Notice: Subject to any disclaimer, the term of this patent is extended or adjusted under 35 U.S.C. 154(b) by 0 days.

(21) Appl. No.: 13/488,970

(22) Filed: Jun. 5, 2012

(65) Prior Publication Data

US 2012/0250817 A1    Oct. 4, 2012

Related U.S. Application Data

(62) Division of application No. 12/981,744, filed on Dec. 30, 2010, now Pat. No. 8,218,714.

(30) Foreign Application Priority Data

Dec. 30, 2009    (CN) .......................... 2009 1 0157035

(51) Int. Cl.
*H03K 23/00* (2006.01)
(52) U.S. Cl. .......... 377/118; 377/119; 377/120; 377/33; 377/34
(58) Field of Classification Search .......... None
See application file for complete search history.

(56) References Cited

U.S. PATENT DOCUMENTS

| | | | |
|---|---|---|---|
| 5,621,336 A | | 4/1997 | Shibata et al. |
| 5,644,253 A | * | 7/1997 | Takatsu .......................... 326/35 |
| 5,822,497 A | | 10/1998 | Ohmi et al. |
| 5,937,399 A | * | 8/1999 | Ohmi et al. ..................... 706/33 |
| 6,384,624 B1 | | 5/2002 | Yasuura et al. |

OTHER PUBLICATIONS

Jing Shen et, al., "Application of Neuron-MOS to Current-Mode Multi-Valued Logic Circuits", May 1998, Multiple-Valued Logic, 1998. Proceedings. 1998 28th IEEE International.

* cited by examiner

*Primary Examiner* — Tuan T Lam
(74) *Attorney, Agent, or Firm* — WPAT PC; Justin King

(57) ABSTRACT

The present invention discloses a vMOS based multi-valued counter unit. The counter unit includes a vMOS source follower and at least a control gate connected the vMOS source follower. The control gate includes a first dual-value D flip-flop, a second dual-value D flip-flop, an AND gate, and an OR gate. The present invention utilizes the vMOS to replace the complicated threshold value operations of the multi-value logic. The current invention implements the true multi-value logic and a multi-base multi-value counter by increasing the number of the dual-value D flip-flop, and connecting the dual-value D flip-flop to the input control gate of the vMOS follower. The present invention applies the asynchronous carry-over concept to implement the multi-digit multi-value counter, and it also has been verified by the simulation of P Simulation Program with Integrated Circuit Emphasis (SPICE).

1 Claim, 5 Drawing Sheets

VMOS MULTI-VALUED COUNTER UNIT

CROSS-REFERENCE TO RELATED APPLICATIONS

This application is a divisional of U.S. patent application Ser. No. 12/981,744 filed on Dec. 30, 2010 now U.S. Pat. No. 8,218,714.

BACKGROUND OF THE INVENTION

Field of the Invention

This invention relates to a multi-valued counter unit, particularly a counter includes a neuron metal oxide semiconductor (vMOS) transistor and a counter operates as a multi-digit multi-valued counter.

Currently, the integrated circuit is advancing at an incredible speed almost beyond the law of Moore. As the integrated circuit increases in its scale and speed, it also leads to a higher power consumption of integrated circuits. Such high power demand from a chip not only causes difficulties for supplying the power to those portable devices employing such circuit, it also causes problem of overheating, shorten the chip's lift expectancy, and ultimately leads to failure. On the other hand, due to the advancement of the semiconductor process technology, the area occupied by gates in a semiconductor has declined dramatically. However, while the area occupied by gates in a semiconductor has declined dramatically, the area for routing has increased. In Very Large-Scale Integrated circuit (VLSI), 70% of the silicon area has been occupied by routing. Such high density routing not only limits the circuit integration, it also increases the cost of production. Furthermore, the electromagnetic effects between the lines will lead to circuit performance degradation, and even unexpected error.

Multi-valued logic circuits increase the ability to carry information on any given single line. It improves the capacity of signal, and it also improves the information density of digital circuits, and it also reduces the number of VLSI wires and reduces the wiring complexity and cost, which improves the circuit reliability. However, the conventional multi-valued circuits are formed by the binary components, due to the nature of the binary components, as increment of the digit; the circuit structure becomes more complex, which hinders the multi-valued logic circuit's development. A counter is an important component in the digital integrated circuit; in particular, a multi-valued counter constitutes the most important components of a system. For a commonly known four-value counter, its design comparing to a dual-value counter is not completely the same. The design of the four-value counter needs to address the following two issues: 1) it needs to provide four outputs for the four-value counter; 2) it needs to carry a lower digit to a higher digit in the four-value counter. Conventional four-value counter is implemented with four-value D flip-flops and four-value gates. These four-value components are complex in both structure and design, such that these four-value components lead to higher costs and high power consumption, and hinder the circuit's integration.

vMOS transistor provides multi-input signal control and floating gate capacitive coupling effect, it also has the ability to store data in the floating-gate. vMOS transistor is developed to increase the conventional MOS transistor functionality, in particular, to support the concept of intelligent argument. The vMOS transistor includes a multi-input gate; it provides the ability to calculate the inputs of the multi-input gate, and it utilizes the input and calculated result to control the transistor. It is called the "vMOS transistor" because it mimics the multi-inputs feature of the biological neurons, and it also simulates the functions of biological neurons. The vMOS transistor is also called "neuron MOS transistor".

The basic structures of vNMOS transistor are shown in FIG. 1(a) and FIG. 1(b). As illustrated in the figures, although both vMOS transistor and conventional MOS transistor share some similarities, the differences in floating gates and the multi-input control gates provides the characteristic of the vMOS transistor. The vMOS transistor is not controlled by any given single signal; rather it is controlled by the calculated result of every input signal.

Based on the advantage of the vMOS transistor, the vMOS transistor provides a greater potential applicability compared with conventional MOS transistor. Based on the characteristics of the vMOS transistor, as illustrated in the FIG. 2(a) and FIG. 2(b), a basic circuit unit is formed by combining a vNMOS and a vPMOS.

FIG. 2(a) illustrates a vMOS inverter. Such inverter has a similar structure as an ordinary CMOS inverter, except that the vMOS is controlled by multiple input gates. When the calculated result from the input signals of the gates is greater than the voltage of the floating gate, the vNMOS is conducted and the vPMOS is not conducted, and the output is low. When the calculated result from the input signals of the gates is smaller than the voltage of the floating gate, the vPMOS is conducted and the vNMOS is not conducted, and the output is high.

FIG. 2(b) illustrates a vMOS source follower. The vPMOS in FIG. 2(b) is in a non-conducted state, which means that the source of the vPMOS is connected to an infinite resistance. Such resistance is far larger than the resistance value of the vNMOS, so the output voltage $V_{OUT} \approx V_{FGn} - V_{tn}$. If the threshold voltage $V_{tn}$ is small enough, then $V_{OUT} \approx V_{FGn}$, which the output voltage is similar to the output voltage $V_{FGn}$ of the floating gate voltage.

SUMMARY OF THE INVENTION

The present invention provides a solution to overcome the afore mentioned technical problems, and provides a vMOS based multi-valued counter unit with a low cost and low power consumption, which improves design of the integrated circuit.

The present invention provides a vMOS based multi-value counter comprising a vMOS source follower and a trigger circuit. The vMOS source follower comprises a first control gate, a second control gate, and a third control gate. The trigger circuit comprises a first dual-value D flip-flop with a first flip-flop input terminal, a second flip-flop input terminal, a first flip-flop output terminal, and a second flip-flop output terminal, a second dual-value D flip-flop with a third flip-flop input terminal, a fourth flip-flop input terminal, a third flip-flop output terminal, and fourth flip-flop output terminal, an AND gate with a first AND gate input terminal, a second AND gate input terminal, and an AND gate output terminal; and an OR gate with a first OR gate input terminal, a second OR gate input terminal, and an OR gate output terminal; wherein the second flip-flop input terminal receives a clock signal, the fourth flip-flop input terminal receives the clock signal, the fourth flip-flop output terminal outputs to the first flip-flop input terminal, the first flip-flop output terminal outputs to the third flip-flop input terminal and the first OR gate input terminal, the second flip-flop output terminal outputs to the second AND gate input terminal, the third flip-flop output terminal outputs to the first AND gate input terminal and the second OR gate input terminal, the third flip-flop output terminal further outputs to the second control gate, the AND gate output outputs to the third control gate, and the OR gate output outputs to the first control gate.

The present invention further provides a vMOS based multi-digit multi-value counter comprising a first multi-value counter, a second multi-value counter, and a supplemental AND gate. The first multi-value counter comprises a vMOS source follower and a trigger circuit. The neuron comprises a first control gate, a second control gate, and a third control gate. The trigger circuit comprises a first dual-value D flip-flop with a first input terminal, a second input terminal, a first output, and a second output, a second dual-value D flip-flop with a third input terminal, a fourth input terminal, a third output, and fourth output, a trigger circuit AND gate with a first trigger circuit AND gate input terminal, a second trigger circuit AND gate input terminal, and a trigger circuit AND gate output; and an OR gate with a first OR gate input terminal, a second OR gate input terminal, and an OR gate output; wherein the second input terminal receives a first clock signal, the fourth input terminal receives the first clock signal, the fourth output outputs to the first input terminal, the first output outputs to the third input terminal and the first OR gate input terminal, the second output outputs to the first trigger circuit AND gate input terminal, the third output outputs to the second trigger circuit AND gate input terminal and the second OR gate input terminal, the third output further outputs to the second control gate, the trigger circuit AND gate output outputs to the third control gate, and the OR gate output outputs to the first control gate. The second multi-value counter comprises a clock input terminal. The supplemental AND gate comprises a first supplemental AND gate input terminal, a second supplemental AND gate input terminal, and a supplemental AND gate output; wherein the supplemental AND gate output outputs to the clock input terminal, the second output outputs to the first supplemental AND gate input terminal, and the third output outputs to the second supplemental AND gate input terminal.

Compared with the existing technology, the advantages of the present invention are the multi-value counter unit, the neural tube replaces the multi-valued MOS complex logic threshold operation to achieve truly multi-valued logic, as long as the value added by the two D flip-flop trigger circuit consisting of the number of units and with the free source follower connected to the input control gate, which can achieve more than the base value of different counters. Counters with the traditional multi-valued compared to a reduced number of components, reducing cost and power circuit design. The value of the counter unit is in a multi-invention on the basis of the asynchronous binary way to achieve a number of multi-valued counters, PSPICE simulation results using the designed circuit have proved the correct logic function.

DETAILED DESCRIPTION OF THE PREFERRED EMBODIMENT

The following is a detailed description for the embodiments of the current invention.

Figure 1:
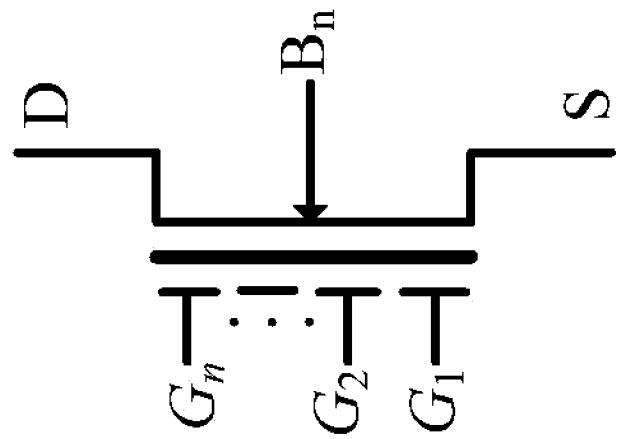
FIG. 1(a) is a basic structure of vNMOS.
FIG. 1(b) is a vNMOS circuit design schematic diagram.
Figure 1:
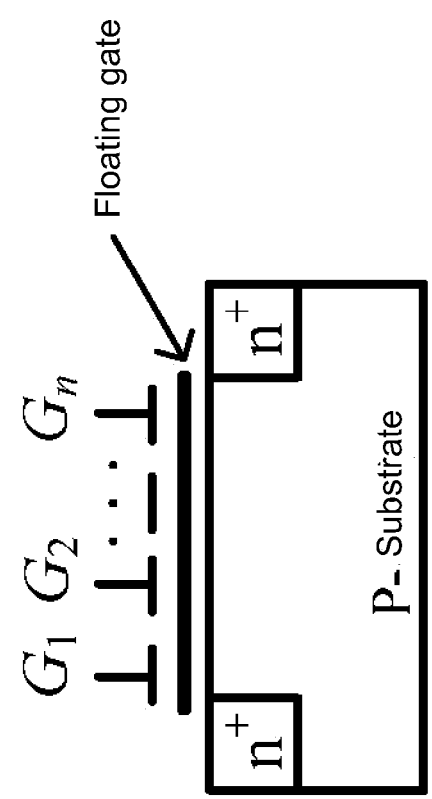
Figure 2:
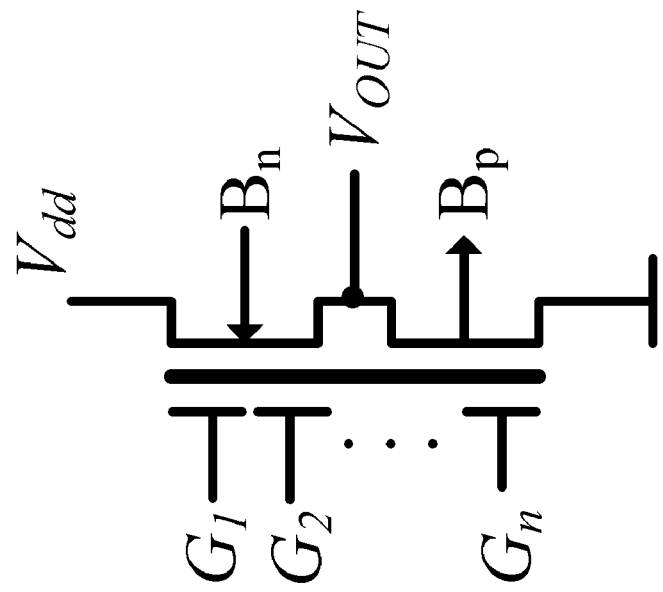
FIG. 2(a) is a schematic diagram of an inverter composed by a vNMOS and a PMOS.
FIG. 2(b) is a schematic diagram of a follower composed by a vNMOS and a PMOS.
Figure 2:
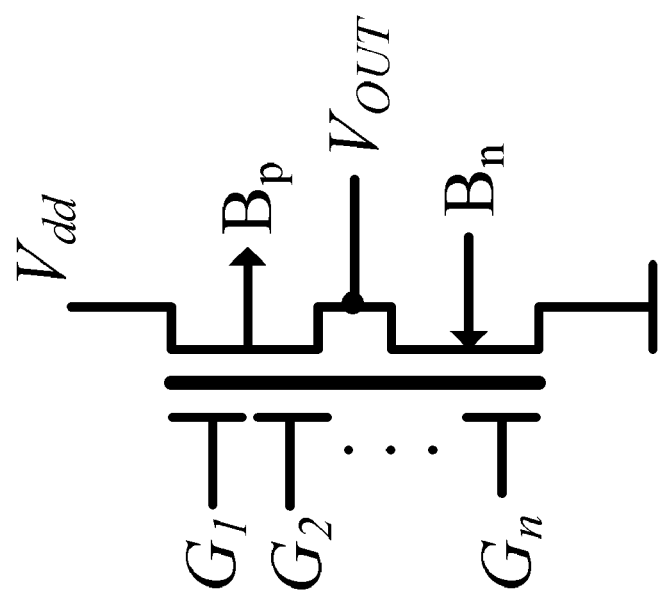
Figure 3:
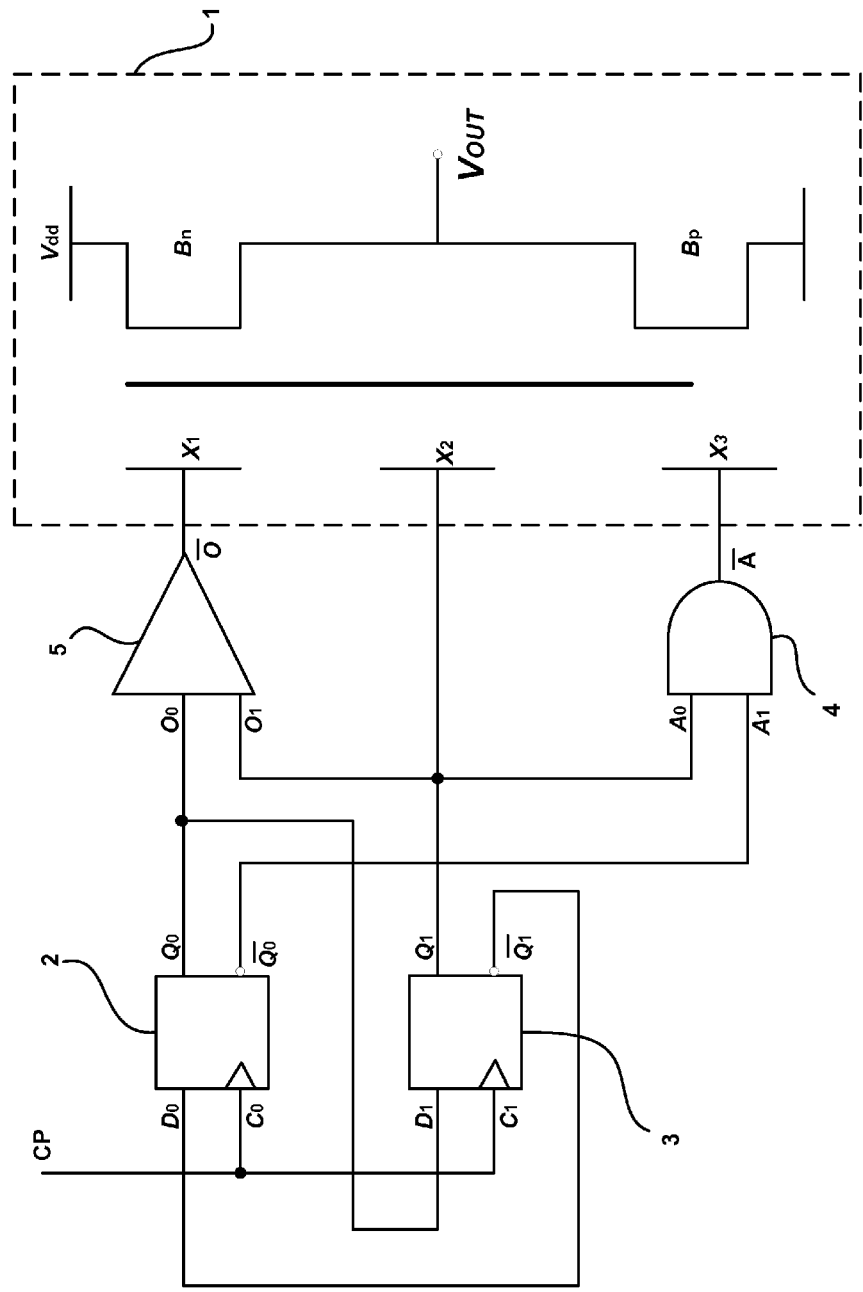
FIG. 3 is a structure diagram of the first embodiment according to the current invention.

In the first embodiment according to the current invention, as illustrated in FIG. 3, it includes a vMOS source follower 1 and a trigger circuit. The vMOS source follower 1 comprises a first control gate X1, a second control gate X2, and a third control gate X3. The trigger circuit comprises a first dual-value D flip-flop 2 with a first flip-flop input terminal D0, a second flip-flop input terminal C0, a first flip-flop output terminal $Q_0$, and a second flip-flop output terminal $\overline{Q_0}$, a second dual-value D flip-flop 3 with a third flip-flop input terminal D1, a fourth flip-flop input terminal C1, a third flip-flop output terminal $Q_1$, and fourth flip-flop output terminal $\overline{Q_1}$, an AND gate 4 with a first AND gate input terminal A0, a second AND gate input terminal A1, and an AND gate output terminal $\overline{A}$; and an OR gate 5 with a first OR gate input terminal O0, a second OR gate input terminal O1, and an OR gate output terminal $\overline{O}$, wherein the second flip-flop input terminal C0 receives a clock signal CP, the fourth flip-flop input terminal C1 also receives the clock signal CP, the fourth flip-flop output terminal $\overline{Q_1}$ outputs to the first flip-flop input terminal D0, the first flip-flop output terminal Q0 outputs to the third flip-flop input terminal D1 and the first OR gate input terminal O0, the second flip-flop output terminal $\overline{Q_0}$ outputs to the second AND gate input terminal A1, the third flip-flop output terminal Q1 outputs to the first AND gate input terminal A0 and the second OR gate input terminal O1, the third flip-flop output terminal Q1 further outputs to the second control gate X2, the AND gate output terminal $\overline{A}$ outputs to the third control gate X3, and the OR gate output terminal $\overline{O}$ outputs to the first control gate X1.

Figure 4:
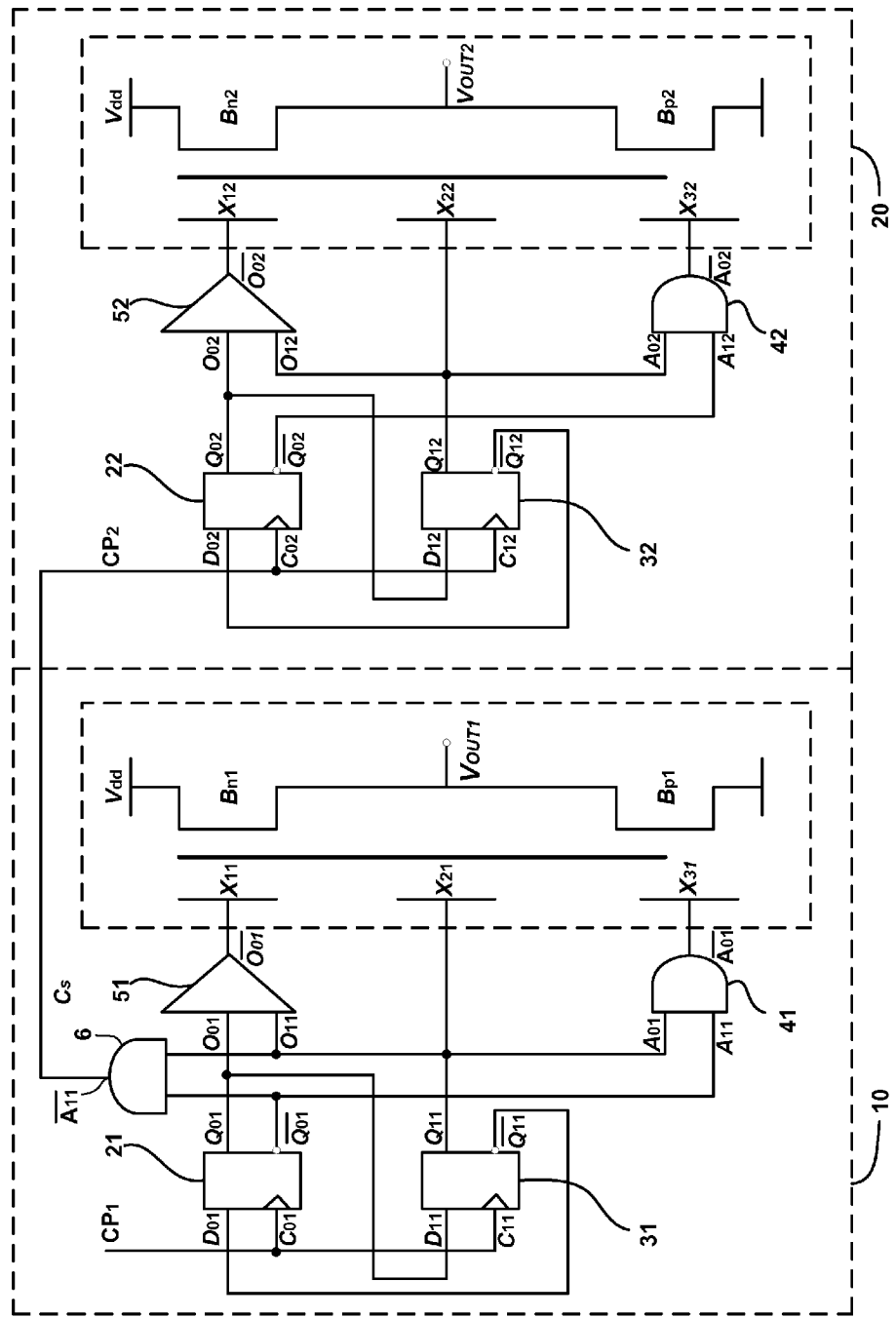
FIG. 4 is a structure diagram of the second embodiment according to the current invention.

In another embodiment of the present invention, as illustrated in FIG. 4, it includes a first multi-value counter 10, a second multi-value counter 20, and a supplemental AND gate 6. The first multi-value counter 10 and the second multi-value counter 20 share the similar structure. The first multi-value counter 10 comprises a vMOS source follower and a trigger circuit. The neuron comprises a first control gate X11, a second control gate X21, and a third control gate X31. The trigger circuit comprises a first dual-value D flip-flop 21 with a first input terminal D01, a second input terminal C01, a first output terminal $Q_{01}$, and a second output terminal $\overline{Q_{01}}$, a second dual-value D flip-flop 31 with a third input terminal D11, a fourth input terminal C11, a third output terminal $Q_{11}$, and fourth output terminal $\overline{Q_{11}}$, a trigger circuit AND gate 41 with a first trigger circuit AND gate input terminal $A_{01}$, a second trigger circuit AND gate input terminal $A_{11}$, and a trigger circuit AND gate output $\overline{A_{01}}$, and an OR gate with a first OR gate input terminal $O_{01}$, a second OR gate input terminal O11, and an OR gate output terminal $\overline{O_{01}}$, wherein the second flip-flop input terminal $C_{01}$ receives a first clock signal $CP_1$, the fourth flip-flop input terminal $C_{11}$ also receives the first clock signal $CP_1$, the fourth flip-flop output $\overline{Q_{11}}$ outputs to the first input terminal $D_{01}$, the first output terminal $Q_{01}$ utputs to the third input terminal $D_{11}$ and the first OR gate input terminal $O_{01}$, the second output terminal $\overline{Q_{01}}$, outputs to the second trigger circuit AND gate input terminal $A_{11}$, the third output terminal $Q_{11}$ outputs to the first trigger circuit AND gate input terminal $A_{01}$ and the second OR gate input terminal $O_{11}$, the third output terminal $Q_{11}$ further outputs to the second control gate $X_{21}$, the trigger circuit AND gate output terminal $\overline{A_{01}}$ outputs to the third control gate $X_{31}$, and the OR gate output terminal $\overline{O_{01}}$ outputs to the first control gate $X_{11}$. The second multi-value counter comprises a clock input terminal $CP_2$. The supplemental AND gate comprises a first supplemental AND gate input terminal $A_{21}$, a second supplemental AND gate input terminal $A_{31}$, and a supplemental AND gate output terminal $\overline{A_{11}}$; wherein the supplemental AND gate output terminal $\overline{A_{11}}$ outputs a carry-over signal $C_S$ to the clock input terminal $CP_2$, the second flip-flop output terminal $\overline{Q_{01}}$ outputs to the first supplemental AND gate input terminal $A_{31}$, and the third flip-flop output terminal $Q_{11}$ outputs to the second supplemental AND gate input terminal $A_{31}$.

The current embodiment is a type of Moore machine since the outputs of its two-digit four-value counter depterminals on the state of the memory circuit. It can only change its current state into the next state under the control of a clock signal. The four-value counter has four different values, which requires four different states ($S_0$, $S_1$, $S_2$, $S_3$) to achieve the corresponding output. At the same time, in order to avoid the competition among different states, it will be encoded by using Gray code. The Table 1 below illustrates the conversion process for different states within the four-value counter.

TABLE 1

A fourth value of the counter state transition table

| Status | State Encoding | | Output signal (four value) |
|---|---|---|---|
| | $Q_1$ | $Q_0$ | $V_{OUT}$ |
| $S_0$ | 0 | 0 | 0 |
| $S_1$ | 0 | 1 | 1 |
| $S_2$ | 1 | 1 | 2 |
| $S_3$ | 1 | 0 | 3 |
| $S_0$ | 0 | 0 | 0 |

As a Moore (Moore)-type circuit, the next state $Q_1^{n+1}Q_0^{n+1}$ is depterminaling on the values of the current state $Q_1^n Q_0^n$, it can then get the Karnaugh map for next state with the following equation:

$$Q_0^{n+1} = \overline{Q_1}\ Q_1^{n+1} = Q_0$$

With the dual-value D flip-flop, it is relatively straight forward to achieve state switching and cycling among four states $S_0$, $S_1$, $S_2$, and $S_3$. But such practice will still output a dual-value signal. In order to realize the four-value output, it is necessary to switch from the dual-value to four-value. The vMOS source follower has multiple input ports, and it can weight each input signal and calculate the result accordingly. Based on this feature, the vMOS can be used to convert dual-value signal into four-value signal. Based on the discussion above, the output voltage of the source follower is close to the floating gate voltage; therefore, the n variables follower output voltage is:

$$V_{OUT} \approx V_{FGn} = \frac{C_1 V_1 + C_2 V_2 + \ldots + C_n V_n}{C_1 + C_2 + \ldots + C_n}$$

If the vMOS source follower's input variables is 3, and $C_1 = C_2 = C_3 = C$, the formula can be simplified as:

$$V_{OUT} \approx \frac{CV_1 + CV_2 + CV_3}{3C} = \frac{V_1 + V_2 + V_3}{3}$$

In order to achieve the connection between the two-digit dual-value counter and the tri-input vMOS source follower, it is necessary to add a switching or conversion circuit in between. According to the characteristics of the two-digit dual-value counter and the way vMOS source follower calculates its inputs, the following Table 2 illustrates values of the conversion circuit:

TABLE 2

Conversion circuit state transition table

| $Q_1 Q_0$ | $X_1$ | $X_2$ | $X_3$ |
|---|---|---|---|
| 00 | 0 | 0 | 0 |
| 01 | 1 | 0 | 0 |
| 11 | 1 | 1 | 0 |
| 10 | 1 | 1 | 1 |

The Table 2 illustrates the $Q_1$ and $Q_0$ as the output signals of the dual-value counter, $X_1$, $X_2$, and $X_3$ as the three input signals for the tri-input vMOS source follower, $V_1$, $V_2$, $V_3$ as the corresponding voltages. It then concludes the followings:

$$X_1 = Q_1 + Q_0\ X_2 = Q_1\ X_3 = Q_1 \overline{Q_0}$$

Therefore, if $Q_1 Q_0 = 00$, then $X_1 = 0$, $V_1 = 0v$, $X_2 = 0$, $V_2 = 0v$, $X_3 = 0$, $V_3 = 0v$, and $V_{OUT} = 0v$ (logic 0); if $Q_1 Q_0 = 01$, then $X_1 = 1$, $V_1 = V_{dd}$, $X_2 = 0$, $V_2 = 0v$, $X_3 = 0$, $V_3 = 0v$, and $V_{OUT} = V_{dd}/3$ (logic 1); if $Q_1 Q_0 = 11$, then $X_1 = 1$, $V_1 = V_{dd}$, $X_2 = 1$, $V_2 = V_{dd}$, $X_3 = 0$, $V_3 = 0V$, $V_{OUT} = 2V_{dd}/3$ (logic 2); if $Q_1 Q_0 = 10$, then $X_1 = 1$, $V_1 = V_{dd}$, $X_2 = 1$, $V_2 = V_{dd}$, $X_3 = 1$, and $V_3 = V_{dd}$, $V_{OUT} = V_{dd}$ (logic 3), thus, it achieves the four output signals of the vMOS source follower, and it provides the circuit structure of a four-value counter as shown in FIG. 3.

In the second embodiment, when the output $V_{out}$ of the lower digit of the two-digit four-value counter is switching from 3 to 0, it carries the value into a higher bit or the next digit. It utilizes this carry-over signal $C_S$ as a clock signal $CP_2$ to control the higher digit of the two-digit four-value counter. As illustrated in the Table 1, the carry-over signal $C_S = Q_1 \overline{Q_0}$, hence, it concludes the circuit design of the two-digit four-value counter as shown in FIG. 4.

Figure 5:
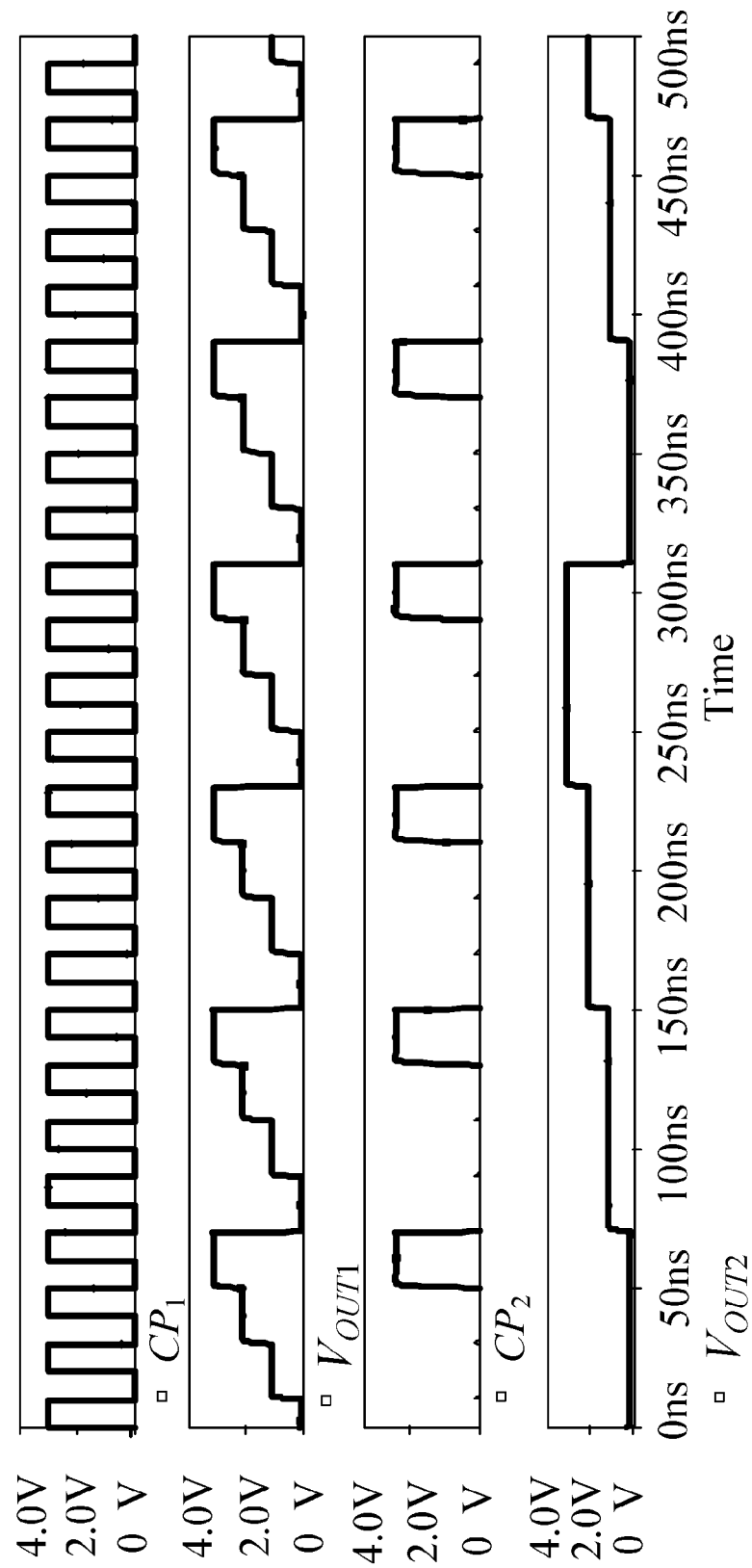
FIG. 5 is a simulated waveform of the two-digit four-valued counter according to the second embodiment of the current invention.

Under the P Simulation Program with Integrated Circuit Emphasis (SPICE) 9.0 environment, with the 0.25 μm CMOS technology, the simulation rterminalers the ideal waveform of the two-digit four-value counter as shown in the FIG. 5. The simulation verifies the logic functions of current invention.

While the invention has been described in terms of what is presently considered to be the most practical and preferred embodiments, it is to be understood that the invention needs not to be limited to the above embodiments. On the contrary, it is intterminaled to cover various modifications and similar arrangements included within the spirit and scope of the appterminaled claims which are to be accorded with the broadest interpretation so as to encompass all such modifications and similar structures.

What is claimed is:
1. A vMOS based multi-value counter unit, comprising:
   a vMOS source follower, comprising,
      a first control gate;
      a second control gate; and
      a third control gate; and a trigger circuit, comprising,
- a first dual-value D flip-flop with a first flip-flop input terminal, a second flip-flop input terminal, a first flip-flop output terminal, and a second flip-flop output terminal;
- a second dual-value D flip-flop with a third flip-flop input terminal, a fourth flip-flop input terminal, a third flip-flop output terminal, and fourth flip-flop output terminal;
- an AND gate with a first AND gate input terminal, a second AND gate input terminal, and an AND gate output terminal; and
- an OR gate with a first OR gate input terminal, a second OR gate input terminal, and an OR gate output terminal;

wherein said second flip-flop input terminal receives a clock signal, said fourth flip-flop input terminal receives said clock signal, said fourth flip-flop output terminal outputs to said first flip-flop input terminal, said first flip-flop output terminal outputs to said third flip-flop input terminal and said first OR gate input terminal, said second flip-flop output terminal outputs to said second AND gate input terminal, said third flip-flop output terminal outputs to said first AND gate input terminal and said second OR gate input terminal, said third flip-flop output terminal further outputs to said second control gate, said AND gate output terminal outputs to said third control gate, and said OR gate output outputs to said first control gate.

* * * * *